US006282848B1

(12) United States Patent
Schlapfer

(10) Patent No.: US 6,282,848 B1
(45) Date of Patent: Sep. 4, 2001

(54) FLOOR, CEILING AND WALL CONSTRUCTION FOR A MAGNETICALLY SHIELDED ROOM

(75) Inventor: Urs Schlapfer, Hausmattrain (CH)

(73) Assignee: Imedco AG, Hagendorf (CH)

( * ) Notice: Subject to any disclaimer, the term of this patent is extended or adjusted under 35 U.S.C. 154(b) by 0 days.

(21) Appl. No.: 09/306,305

(22) Filed: May 6, 1999

Related U.S. Application Data

(60) Provisional application No. 60/084,694, filed on May 8, 1998.

(51) Int. Cl.[7] .................................................. E04H 1/12
(52) U.S. Cl. ............................ 52/79.1; 52/265; 52/268; 52/403.1; 52/480; 52/481.1
(58) Field of Search .......................... 52/79.1, 262, 263, 52/265, 267, 268, 269, 272, 403.1, 480, 481.1, 796.1; 174/35 R

(56) References Cited

U.S. PATENT DOCUMENTS

| | | |
|---|---|---|
| 1,789,827 * | 1/1931 | McKay ............................ 52/481.1 X |
| 2,440,763 * | 5/1948 | Todhunter ............................. 52/262 |
| 3,557,777 | 1/1971 | Cohen . |
| 4,507,520 | 3/1985 | Lindgren . |
| 4,651,099 | 3/1987 | Vinegar et al. . |
| 4,691,483 | 9/1987 | Anderson . |
| 4,755,630 | 7/1988 | Smith et al. . |
| 4,794,206 | 12/1988 | Weinstein . |
| 4,889,124 | 12/1989 | Schneider . |
| 4,929,802 | 5/1990 | Schaepers et al. . |
| 4,932,180 | 6/1990 | Takahashi et al. . |
| 5,043,529 | 8/1991 | Yarger et al. . |
| 5,063,273 | 11/1991 | Bloks . |
| 5,081,071 | 1/1992 | Hirschkoff . |
| 5,167,098 * | 12/1992 | Blackwelder ..................... 52/272 X |
| 5,335,464 | 8/1994 | Vanesky et al. . |
| 5,452,550 | 9/1995 | Vanesky et al. . |
| 5,544,452 | 8/1996 | Fujita et al. . |
| 5,569,878 * | 10/1996 | Zielinski ........................... 174/35 R |
| 5,583,318 | 12/1996 | Powell . |
| 5,595,801 | 1/1997 | Fahy et al. . |
| 5,603,196 | 2/1997 | Sohlstrom . |
| 5,613,330 | 3/1997 | Perala et al. . |
| 5,749,178 | 5/1998 | Garmong . |
| 5,755,062 * | 5/1998 | Slater .................................. 52/79.1 |

OTHER PUBLICATIONS

Statement of Urs Schlapfer dated Oct. 18, 1999 (2 pages with Appendices A–D).

(List continued on next page.)

Primary Examiner—Beth A. Stephan
Assistant Examiner—Brian E. Glessner
(74) Attorney, Agent, or Firm—Bell, Boyd & Lloyd LLC

(57) ABSTRACT

A floor, wall and ceiling construction for a magnetically shielded room which provides a stable and homogeneous magnetically shielded space or environment having an extremely high attenuation value while absorbing exterior as well as interior vibrations.

64 Claims, 12 Drawing Sheets

OTHER PUBLICATIONS

Karl–Jurgen Best, Jochen Bork, *Magnetically Shielded Rooms in Diagnostics and Semi–Conductor Technology*, Edition 2/91, (13 pages).

A. Mager, L. Borek, *Heavily Magneticallly Shielded Room For Measurements of Extremely Weak Magnetic Fields* (4 pgs., 501–504).

H. Matusba, D. Irisawa, A. Yahara, *Superconducting shield for Biomagnestism Measurement Coupled with Ferro–Magnetic* (2 pgs.).

Y. Okada, B. Shah, *A Two–Shell Magnetically Shielded Room for Magnetophysiology*, (2 pgs.).

Y. Shimbo, K. Nakada, K. Nikki, M. Kabasawa, Y. Uchikawa, M. Kotani, *High Tc Superconducting Magnetic Shields for Biomagnetic Applications*, (2 pgs.).

R.J.P. Bain, G.B. Donaldson, C.M. Pegrum, P. Maas, A.I. Weir, *A Clinically Oriented Shielded Facility for Biomagnetism*, (2 pgs.).

K. Okuda, J. Takeuchi, M. Mukai S. Kuriki, Y. Uchikawa, M. Kotani, *Designing and Inspecting System of Prefabricated Magnetically Shielded Room for Biomagnetism*, (2 pgs.).

N. Ishikawa, N. Kasai, H. Kado, *Shielding Factor of the Box–Shaped MSR for SQUID Measurement* (2 pgs.).

Vacuumschmelze, *GmbH, Magnetically Shielded Rooms for Biomagnetic Investigationss* (4 pgs.).

James P. Antonic, *Understanding Shielding*, Journal of Interference Technology Engineers' Master (pp. 229, 232, 236).

Vaino O. Kelha, Jussi M. Pukki, Risto S. Peltonen, Auvo J. Penttinen, Risto J. Ilmonimi and Jarmo J. Heino, *Design, Construction and Performance of a Large–Volume Magnetic Shield*, IEEE Transactions on Magnetics, vol. Mag–18, No. 1 Jan. 1982 (11 pgs.).

Takenaka Corporation, *Prefabricated Magnetically Shielded Room* literature (2 pgs.).

\* cited by examiner

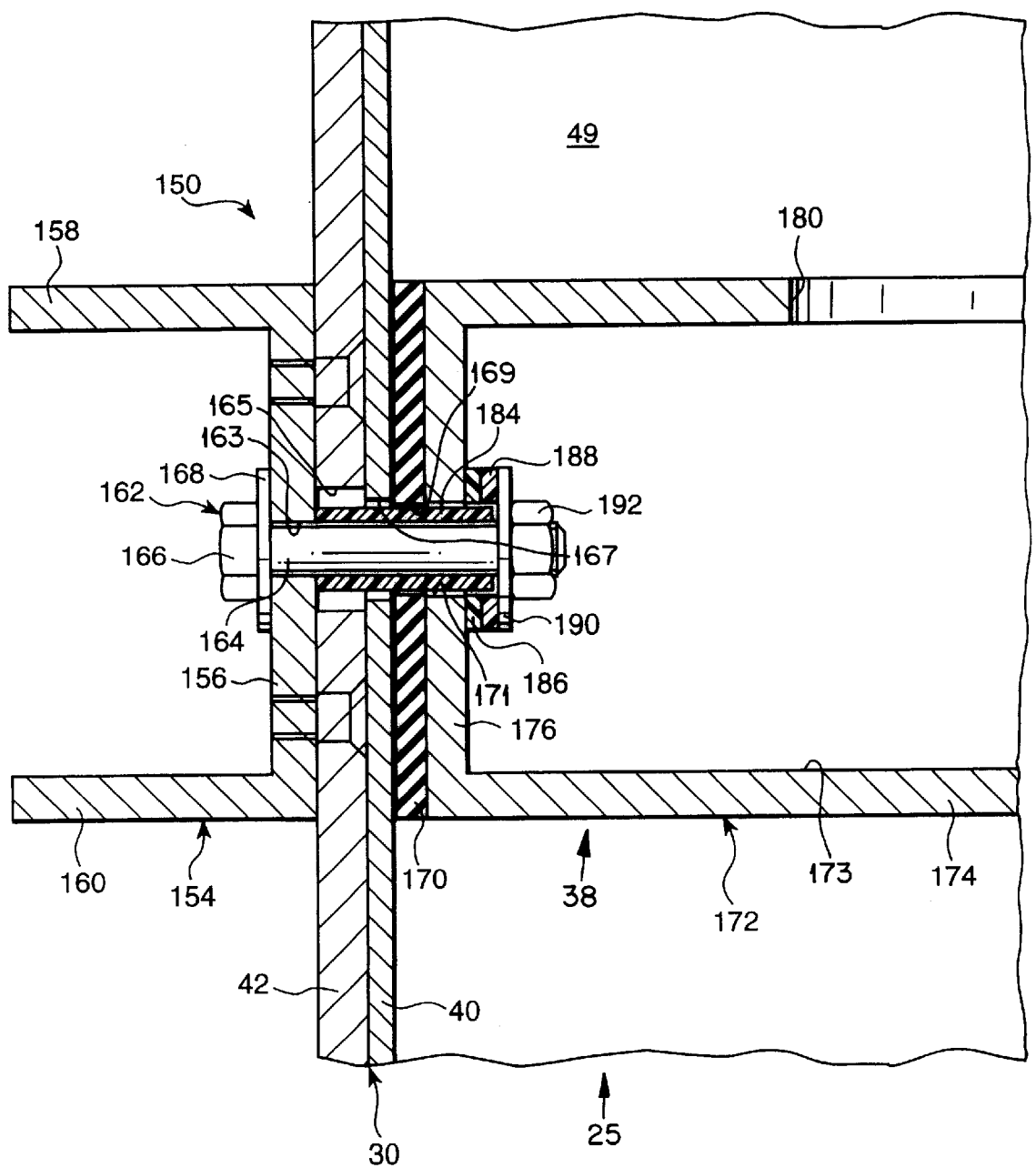

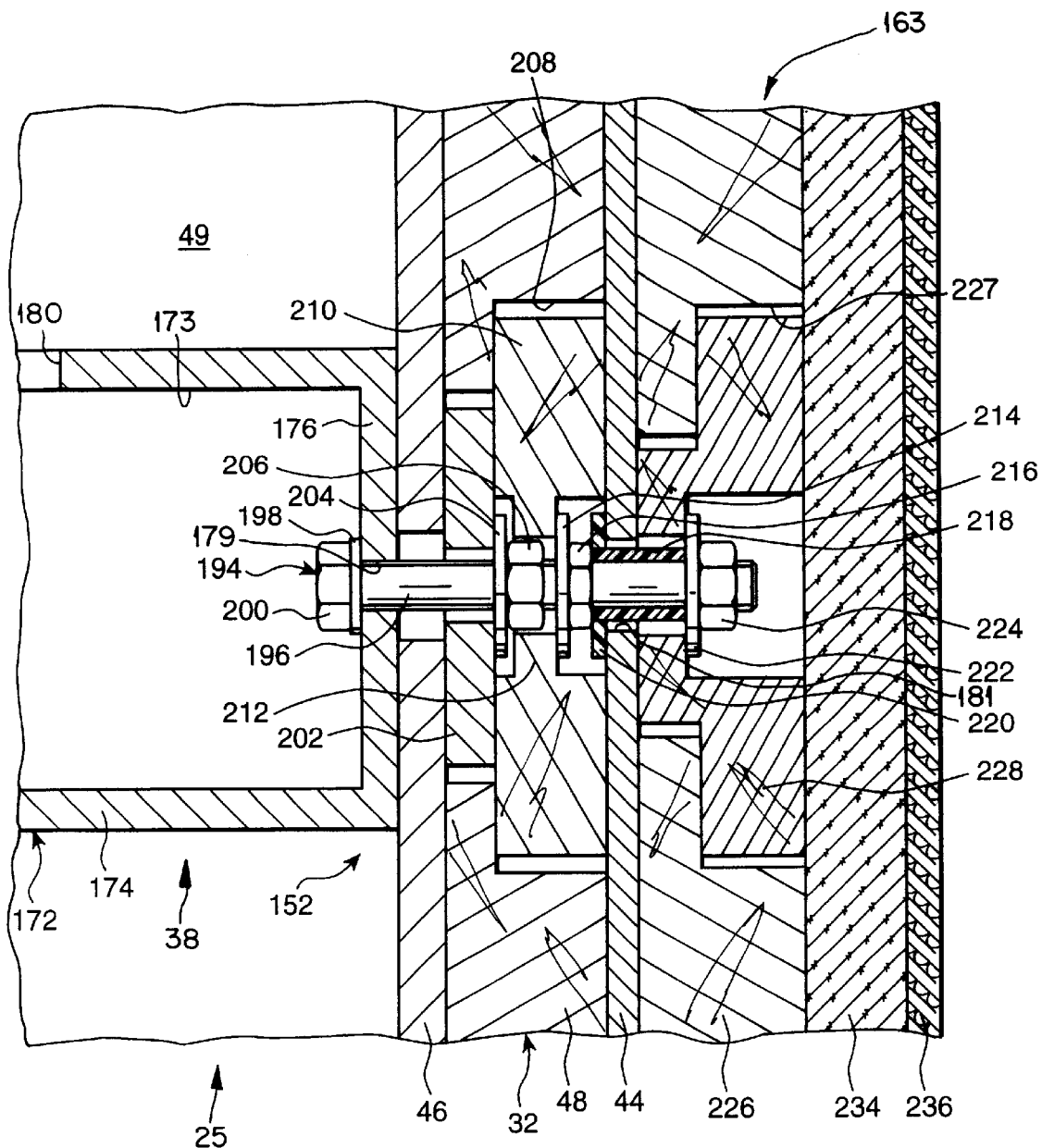

FLOOR, CEILING AND WALL CONSTRUCTION FOR A MAGNETICALLY SHIELDED ROOM

CROSS-REFERENCE TO RELATED APPLICATION

The present application claims the benefit of U.S. Provisional Application No. 60/084,694, filed May 8, 1998.

DESCRIPTION

This invention relates in general to a magnetically shielded room, and more particularly to a floor, ceiling and wall construction for a magnetically shielded room which improves the attenuation characteristics of the magnetically shielded room, decreases deterioration of the attenuation characteristics caused by vibration and normal use of the room and reduces vibration interaction between the parent building and the magnetically shielded room.

BACKGROUND OF THE INVENTION

A magnetically shielded room, commonly referred to as an "MSR", is used to magnetically and electromagnetically isolate sensitive instruments and equipment such as highly sensitive biomagnetic detectors, measuring instruments and super conductive quantum interference devices, commonly referred to as "SQUIDs." Some of these sensitive instruments are used for biomagnetic research and tests to measure minute magnetic fields. To obtain proper readings and results from the sensitive instruments, the environment for conducting these tests must be extremely magnetically quiet. The MSR provides a magnetically and electromagnetically isolated environment for using this equipment by attenuating stray magnetic fields and other magnetic disturbances created or generated by the earth's magnetic field, power lines, current carrying conductors and moving metal masses such as trains, automobiles, elevators and other large metal objects in the vicinity of the MSR. Except for the power lines which create 50/60 hertz frequencies, the above mentioned influences create low or very low frequencies which often approach DC or zero. The earth's magnetic field is in fact a DC field. Since magnetic and electromagnetic shielding of DC to high frequencies is somewhat difficult to obtain, the ideal MSR includes multiple shielding layers or shields of very high magnetic permeability and highly electrically conductive materials capable of attenuating these various frequencies.

The MSR must also provide a stable and homogeneous environment for the small, if any, residual field in the MSR near the sensitive instruments. To achieve this stable and homogeneous environment, the MSR is preferably a six sided cube having a floor, a ceiling, four walls and a door in one of the walls. In the ideal MSR, the floor, ceiling, walls and door have multiple magnetic and electromagnetic shielding layers or shields to obtain high attenuation characteristics and to produce the desired stable and homogeneous environment in the interior chamber of the MSR.

An MSR may lose its attenuation, stability and homogenous characteristics due to vibration from the earth or parent building, the pressure or weight of the sensitive instruments on the weight bearing floor in the MSR and the normal use of the MSR including people walking on the weight bearing floor in the room. Such vibration, pressure, weight and use of the MSR can cause the shielding layers or shields to lose part of their attenuation properties which alter the readings from the sensitive instrument in the MSR, and ultimately the results of the biomagnetic or other research or tests. The ideal MSR room thereby compensates for the weight of the sensitive instrument by separating the weight bearing floor from the shielding layers or shields, and dampens the vibration caused by use of the room as well as from the earth and the parent building.

The use of multiple shielding layers or shields in an MSR creates additional problems, such as electric conductivity or magnetic coupling between the shielding layers or shields. Such electric conductivity may be eliminated by a dielectric separation between the shields, and such magnetic coupling may be substantially reduced by the appropriate separation or spacing of the independent shielding layers or shields with non-magnetically permeable material. In an ideal MSR, at one or more levels, at least one electrically conductive shielding layer or shield is thereby magnetically decoupled and electrically isolated from at least one magnetically permeable shielding layer or shield.

SUMMARY OF THE INVENTION

The present invention overcomes the above problems in providing an improved floor, ceiling and wall construction for a MSR having multiple shielding layers or shields of very high magnetic permeability and highly electrically conductive materials to attenuate magnetic and electromagnetic disturbances in the vicinity of the MSR. The floor construction of the present invention electrically insulates the MSR from the parent building and dampens exterior and interior vibrations including vibration in the weight bearing floor caused by the weight of the sensitive instruments or normal use of the MSR to provide a stable and homogeneous environment in the MSR. The floor, ceiling and wall construction of the present invention further provides desired magnetic decoupling and a dielectric separation between certain electrically conductive and magnetically permeable shielding layers or shields.

The floor construction of the present invention enables the weight bearing floor to rest independent from the shielding layers or shields on a plurality of uniformly distributed separators, columns or stands extending through the shielding layers or shields and supporting the weight bearing floor. Each separator, column or stand includes an interior section, a spacer and an exterior section, which includes a vibration pad that rests on the substrate of the parent building which support the components of the MSR. The vibration pad electrically insulates the MSR from the parent building, directly dampens vibration in the weight bearing floor transmitted through the separators, columns or stands to the vibration pad and further dampens and thus avoids the transmission of building vibration and resonance to the MSR. The floor construction of the present invention therefore provides a double action vibration dampening system which eliminates deterioration of the attenuation characteristics of the shielding layers or shields resulting from pressure or weight on the weight bearing floor and reduces vibration interaction between the parent building and the MSR.

The MSR of the present invention includes an exterior shell surrounding an interior shell. The shells are supported by a plurality of floor separators, columns or stands ceiling separators and wall separators. The exterior shell includes inner and outer shielding layers or shields. The outer shield is a highly conductive non-magnetically permeable material and the inner shield is a highly magnetically permeable material. The interior shell includes inner and outer shields. The outer shield is a highly conductive non-magnetically permeable material and the inner shield is a highly magnetically permeable material. The inner and outer shields of the interior shell are magnetically decoupled and dielectrically separated by a non-conductive insulating layer and non-conductive insulating sleeves and rings. The exterior and interior shells are magnetically decoupled and dielectrically separated by non-conductive separators, sleeves and rings and an air gap or separation between the shells. The exterior and interior shells thereby co-act to attenuate the stray magnetic fields and disturbances created by the earth's magnetic field, power lines, current carrying conductors and moving metal masses near the MSR and create an extremely magnetically quiet environment in the MSR.

It is therefore an object of the present invention to provide a MSR with high attenuation characteristics.

A further object of the present invention is to provide a MSR with a stable and homogeneous environment.

Another object of the present invention is to provide an MSR which dampens external vibration from the parent building and surrounding environment and dampens internal vibration which occurs during the normal use of the MSR.

A still further object of the present invention is to provide an MSR with interior and exterior magnetically decoupled and dielectrically separated shells having very high magnetic permeability and electrically highly conductive materials.

A yet further object of the present invention is to provide an MSR with inner and outer magnetically decoupled and dielectrically separated shielding layers or shields in the interior shell of the MSR.

Other objects, features and advantages of the present invention will be apparent from the following detailed disclosure, taken in conjunction with the accompanying sheets of drawings, wherein like reference numerals refer to like parts.

BRIEF DESCRIPTION OF THE DRAWINGS

FIG. 12 is an enlarged cross-sectional view of the exterior shell of the MSR and the exterior section of the wall separator; and FIG. 13 is an enlarged cross-sectional view of the interior shell of the MSR and the interior section of the wall separator.

DESCRIPTION OF THE INVENTION

Figure 1:
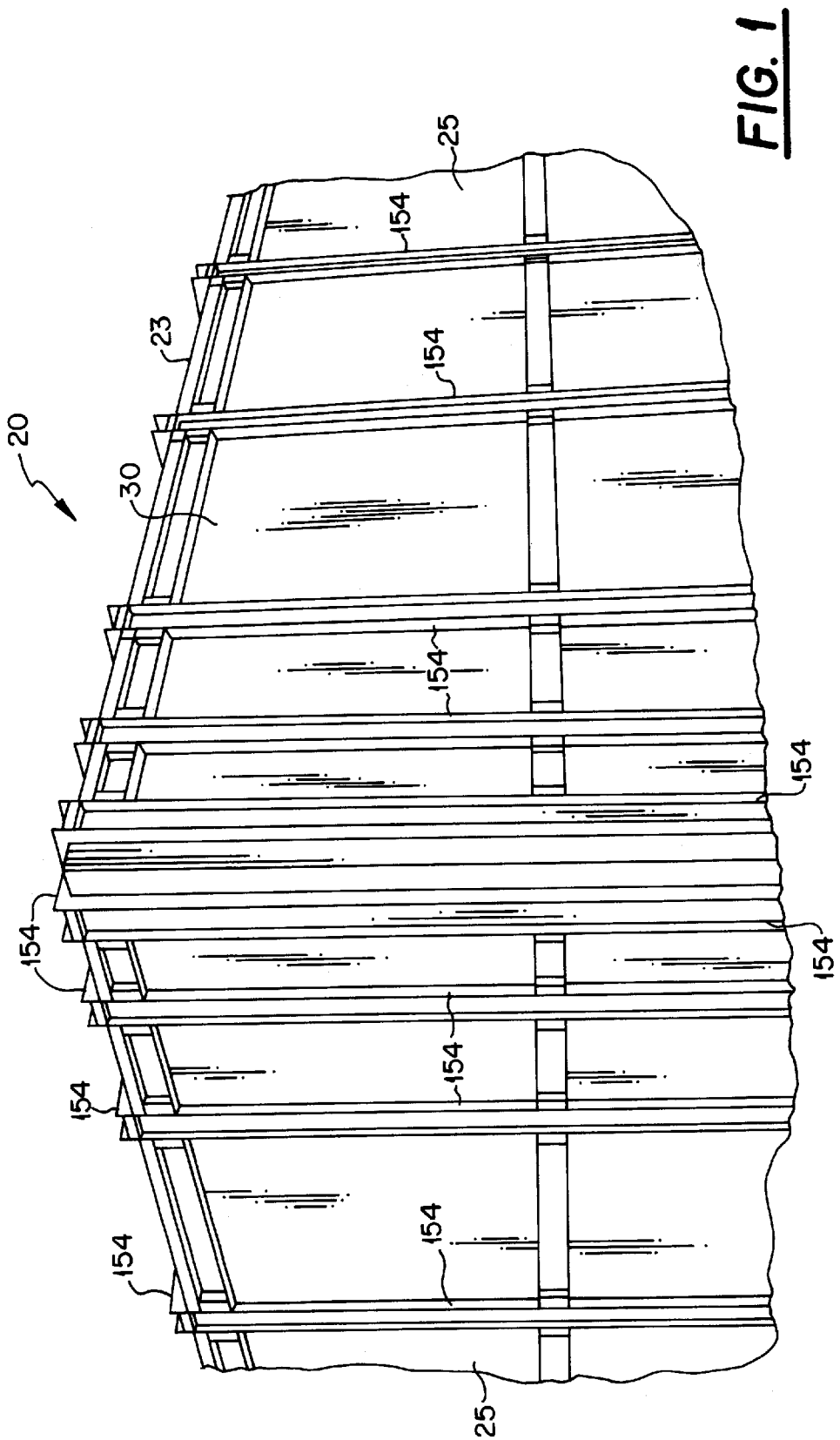
FIG. 1 is a fragmentary perspective view of the exterior of two walls of the MSR of the present invention and the joint between the two walls.

Referring now to the drawings, and particularly to FIGS. 1–2, 3, 5, 8 and 11, a magnetically shielded room (MSR) 20 of the present invention includes a floor 21, a ceiling 23 and two pairs of spaced-apart walls 25 which are connected to each other, attached to the floor 21 and which generally support the ceiling 23. One of the walls includes a door (not depicted) for providing access to an interior chamber of the MSR 20. The walls 25 may include other passageways for bringing utilities into the MSR or for viewing the interior of the MSR 20. The MSR 20 is preferably situated in a parent building to protect the MSR 20 from the elements as well as to prevent people and objects from accidentally contacting the floor 21, ceiling 23 and walls 25 of the MSR 20. The MSR 20 rests in a parent building on a substrate of concrete or other suitable material.

The floor 21, ceiling 23 and walls 25 of the MSR 20 of the present invention include an exterior shell 30 surrounding an interior shell 32. The exterior and interior shells 30 and 32 are evenly spaced-apart and connected by a plurality of floor separators 34 (FIGS. 2, 3 and 5), ceiling separators 36 (FIG. 8) and wall separators 38 (FIG. 11) in the floor 21, ceiling 23 and walls 25, respectively. Each floor separator 34 includes an exterior section 50, a spacer 92 and an interior section 52, and each ceiling and wall separator 36 and 38, respectively, includes an exterior section 150, a spacer 172 and an interior section 152. (The ceiling and wall separators 36 and 38 of the present invention are substantially identical and, therefore, similar elements between the two will be described and numbered similarly). The plurality of separators 34, 36 and 38 are suitably positioned to provide uniform support and weight distribution for the floor 21, ceiling 23 and walls 25, respectively.

The exterior shell 30 includes inner and outer shielding layers or shields 40 and 42, respectively. The outer shield 42 is preferably formed from a highly electrically conductive material such as aluminum. The outer shield 42 may be a single sheet or multiple layers although it is illustrated in the Figures as a single sheet. The inner shield 40 is preferably formed from a highly magnetically permeable material such as a nickel alloy. The inner shield 40 may be a single sheet or multiple layers although it is illustrated in the Figures as a single sheet. The preferred nickel alloy is approximately 80% nickel and is commercially available under the trade name MUMETAL.

The interior shell 32 includes inner and outer shields 44, 46, respectively. The outer shield 46 is preferably formed from a highly electrically conductive material such as aluminum. The outer shield 46 may be a single sheet or multiple layers although it is illustrated in the Figures as a single sheet. The inner shield 44 is preferably formed from a highly magnetically permeable material such as the same nickel alloy as the inner shield 40. The inner shield 44 may be a single sheet or multiple layers although it is illustrated in the Figures as a single sheet. The inner and outer shields 40, 42, 44 and 46 of the interior and exterior shells 30 and 32 may be formed from any material having characteristics similar to the ones described above. The inner and outer shields 44 and 46 of the interior shell 32 are magnetically decoupled by a non-conductive insulating layer 48 such as wood or other suitable material and as further described below. The inner and outer shield 44 and 46 of the interior shell 32 are dielectrically separated by non-conductive insulating members 136 and 138.

The exterior and interior shells 30 and 32 are magnetically decoupled by the spacers 92 and 174. The spacers 92 and 174 of the floor, ceiling and wall separators 34, 36 and 38 separate the exterior shell 30 from the interior shell 32, creating an air gap 49 which magnetically decouples the interior shell 32 from the exterior shell 30. Preferably, the air gap 49 between the shells 30 and 32 is at least four inches or approximately ten centimeters wide between the interior and exterior shells 30 and 32. The inner shields 40 and 44 shield the electromagnetic fields of DC to high frequency, and the outer shields 42 and 46 shield the electromagnetic fields of low to high frequency. The exterior and interior shells 30 and 32 are dielectrically separated by the non-conductive insulating members 102, 104, 106, 184, 186 and 188. The magnetically decoupled and dielectrically separated exterior and interior shells 30 and 32 thereby co-act to attenuate the stray magnetic fields of various frequencies and disturbances created by the earth's magnetic field, power lines, current carrying conductors and moving metal masses near or in the vicinity of the MSR 20 and create an extremely magnetically quiet environment in the MSR 20.

Figure 4:
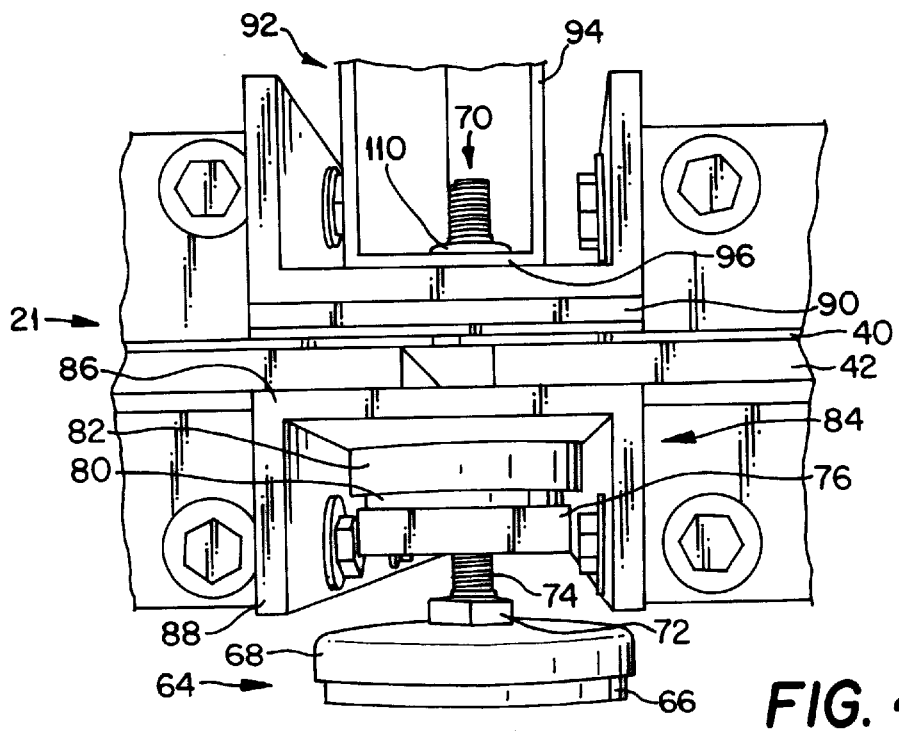
FIG. 4 is a fragmentary front view of the MSR floor construction illustrating the interior and exterior shells and the vibration pads or feet.
Figure 5:
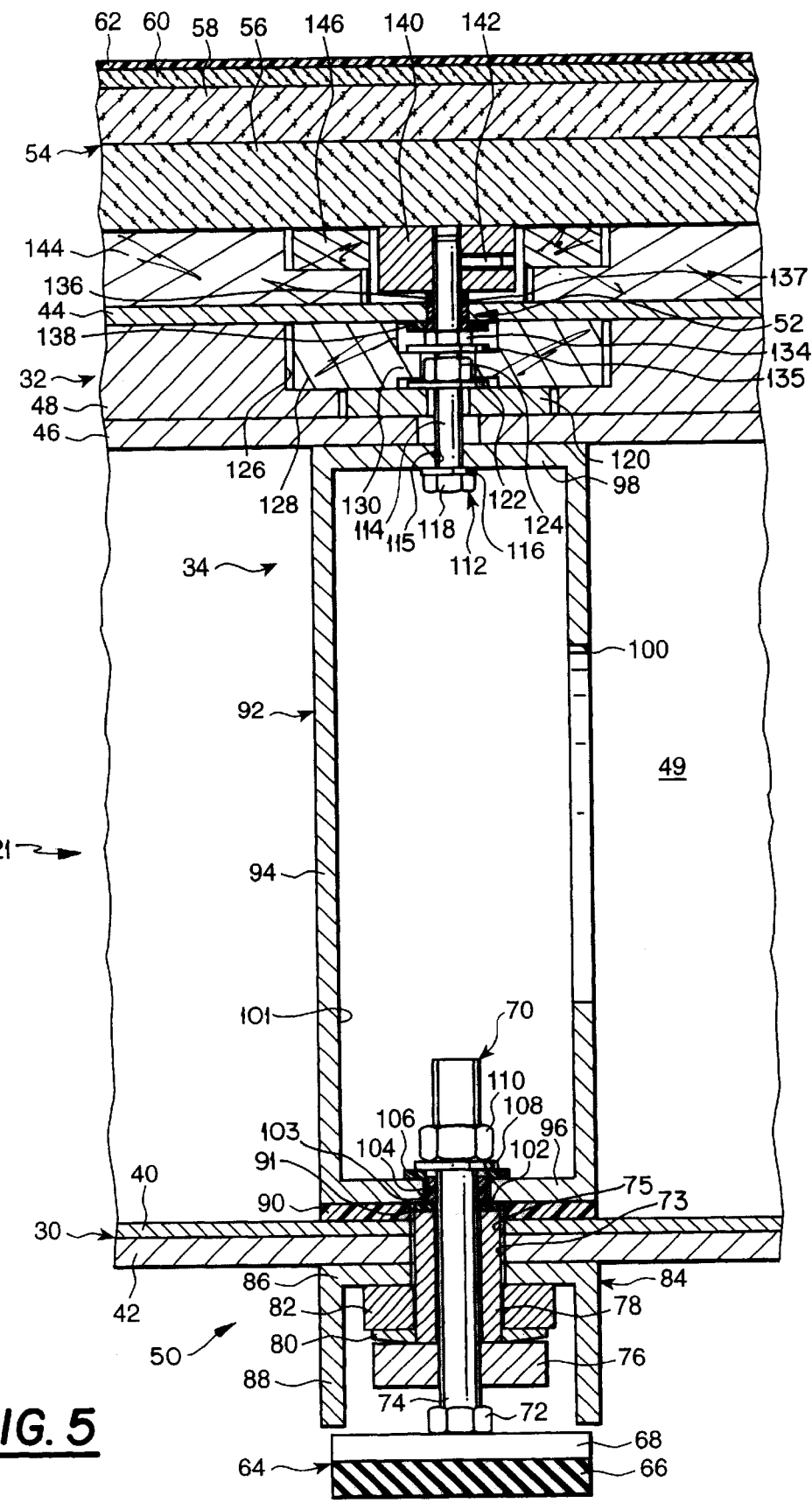
FIG. 5 is a fragmentary cross-sectional view of the MSR floor construction of the present invention illustrating the column or stand supporting, separating and extending through the interior and exterior shells of the MSR.
Figure 6:
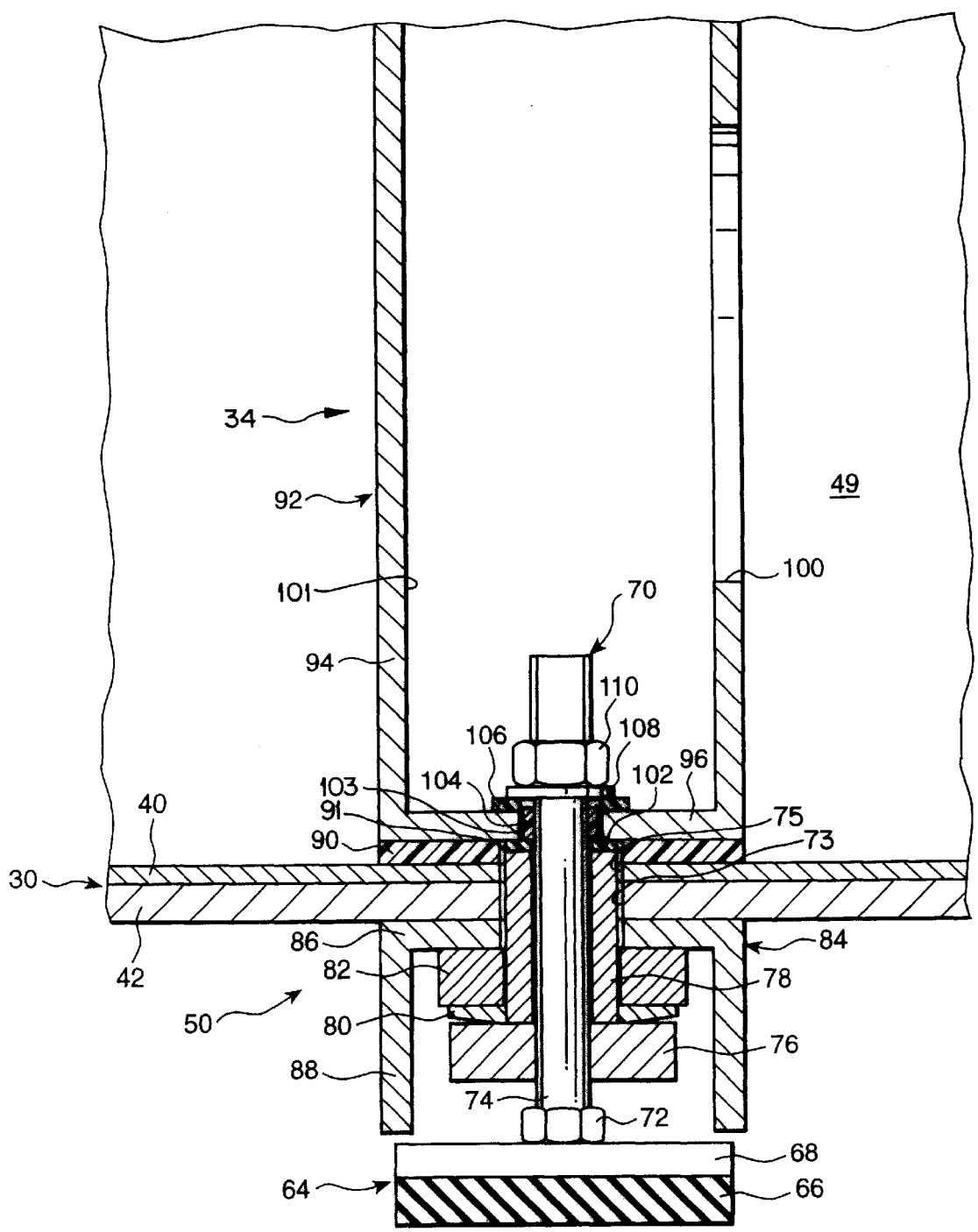
FIG. 6 is an enlarged cross-sectional view of the exterior shell of the MSR and the exterior section of the stand.
Figure 7:
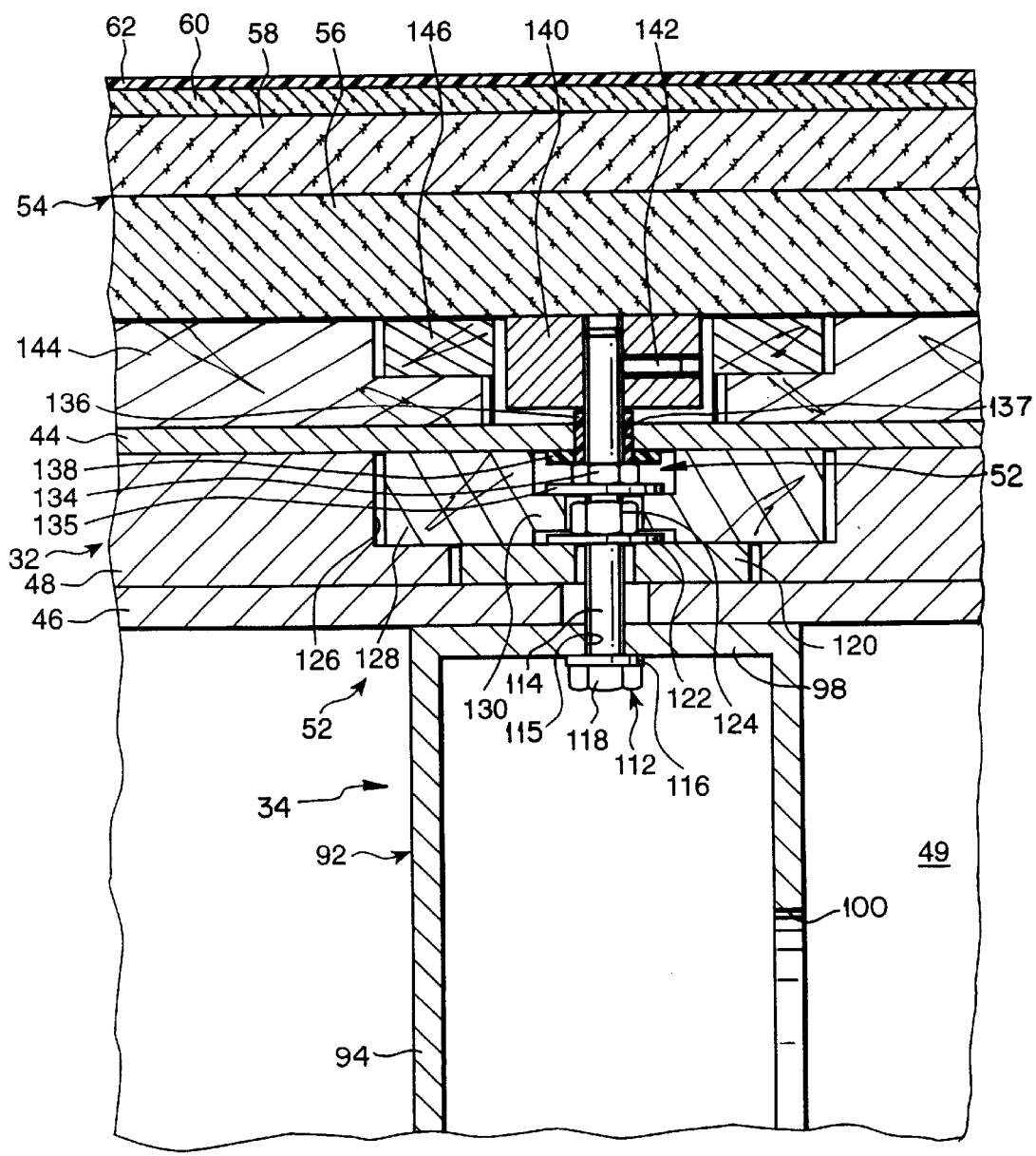
FIG. 7 is an enlarged cross-sectional view of the interior shell of the MSR and the interior section of the stand.
Figure 8:
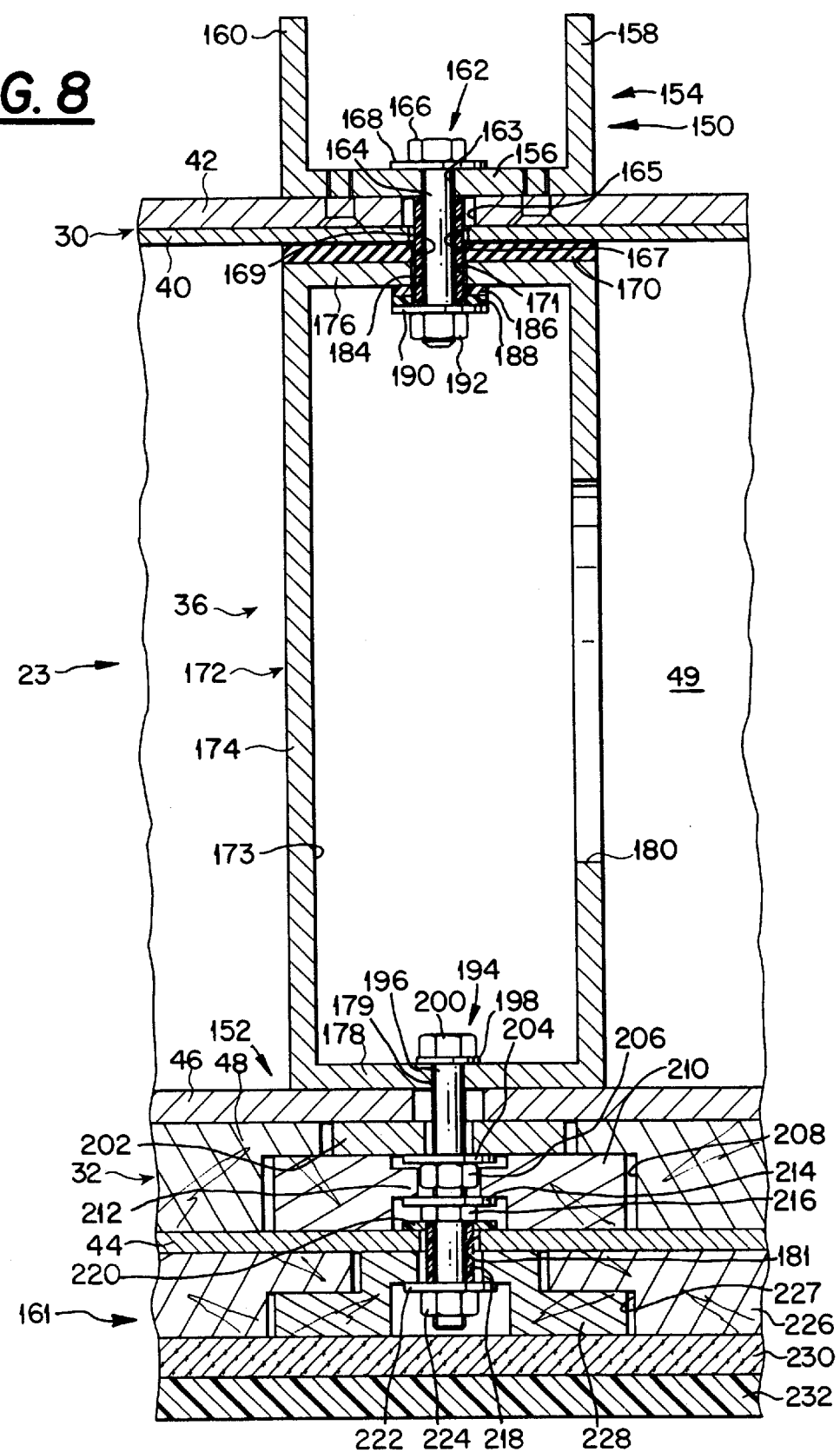
FIG. 8 is a fragmentary cross-sectional view of the MSR ceiling construction of the present invention illustrating the ceiling separator extending through the interior and exterior shells of the MSR.

Referring now specifically to FIGS. 2 to 7, a plurality of floor separators 34 each include a spacer 92, an exterior section 50 illustrated in greater detail in FIG. 6 and an interior section 52 illustrated in greater detail in FIG. 7. Each floor separator 34 is adapted to dampen external vibration from the substrate, parent building or earth and internal pressure, weight or vibration from the sensitive instruments in the MSR 20 and from people walking on the floor and otherwise using the MSR 20. The exterior section 50 of the floor separator 34 rests on the building substrate, supports the exterior shell 30, extends through the exterior shell 30 and connects to the spacer 92. The spacer 92 supports the interior shell 32. The interior section 52 is connected to the spacer 92, extends through the interior shell 32 and supports a weight bearing floor 54 disposed within the floor 21. The exterior and interior sections 50 and 52 suspend and dampen the vibration in the exterior and interior shells 30 and 32, respectively. The exterior and interior sections 50 and 52 are connected by the spacers 92, as discussed in detail below. The exterior section 50, the spacer 92 and the interior section 52 of the separator 34 support the weight bearing floor 54 of the MSR 20 independent from the exterior and interior shells 30 and 32. The separator 34 thereby substantially eliminates deterioration of the attenuation capabilities of the exterior and interior shells 30 and 32 resulting from pressure or weight on the weight bearing floor 54 and reduces vibration interaction between the parent building and the MSR 20. The weight bearing floor 54 of the floor 21, as illustrated in FIGS. 2, 3, 5 and 7, may include two base layers 56 and 58 of chipboard, an intermediate layer 60 of masonite and a floor covering 62 of vinyl, although it should be appreciated that the base layers 56 and 58, intermediate layer 60 and floor covering 62 could be alternatively constructed and formed from other suitable flooring materials.

Referring specifically to FIGS. 4–6, the exterior section 50 of the floor separator 34 includes a vibration pad or foot 64 for absorbing the vibration from the substrate as well as from the weight bearing floor 54. The exterior section 50 further includes a bolt 70, an adjustable supporting member 76, a spacer sleeve 78, a spring washer 80, a supporting sleeve 82 and a bracket 84. The vibration pad 64 consists of a compressible non-conductive rubber absorption pad 66 and a stainless steel mounting plate 68 suitably attached by adhesive or otherwise to the absorption pad 66. The plurality of vibration pads 64 in the floor electrically insulate the entire MSR 20 from the parent building and in particular the substrate and absorb any vibration from the substrate or the weight bearing floor 54. Preferably, the vibration pads 64 are evenly spaced apart under the entire floor 54 of the MSR 20. Additional vibration pads 64 may be utilized at the outer edges of the floor 54 to provide additional support for the weight of the walls and the ceiling.

The bolt 70 is attached to and extends upwardly from the vibration pad 64 through a pair of annular openings 73 and 75 in the inner and outer shields 40 and 42 of the exterior shell 30. In particular, a head 72 of the bolt 70 is welded to the plate 68 of the vibration pad 64. The adjustable supporting member 76, preferably a nut, may be made from stainless steel and is threaded on the shaft 74 of the bolt 70. The supporting nut 76 can be adjusted upwardly or downwardly on the shaft 74 to adjust the position or height of the exterior shell 30, the spacer 92, the interior shell 32 and the weight bearing floor 54 when the MSR 20 is initially constructed. The nut 76 supports the spacer sleeve 78. The spacer sleeve 78 may be made from stainless steel and is journaled about the shaft 74 of the bolt 70. The spacer sleeve 78 extends upwardly through the openings 73 and 75 of the inner and outer shields 40 and 42 of the exterior shell 30. This construction separates the spacer sleeve 78 from the inner and outer shields 40 and 42 and downward force on the spacer sleeve 78 does not cause downward pressure on the inner or outer shields 40 and 42.

Figure 2:
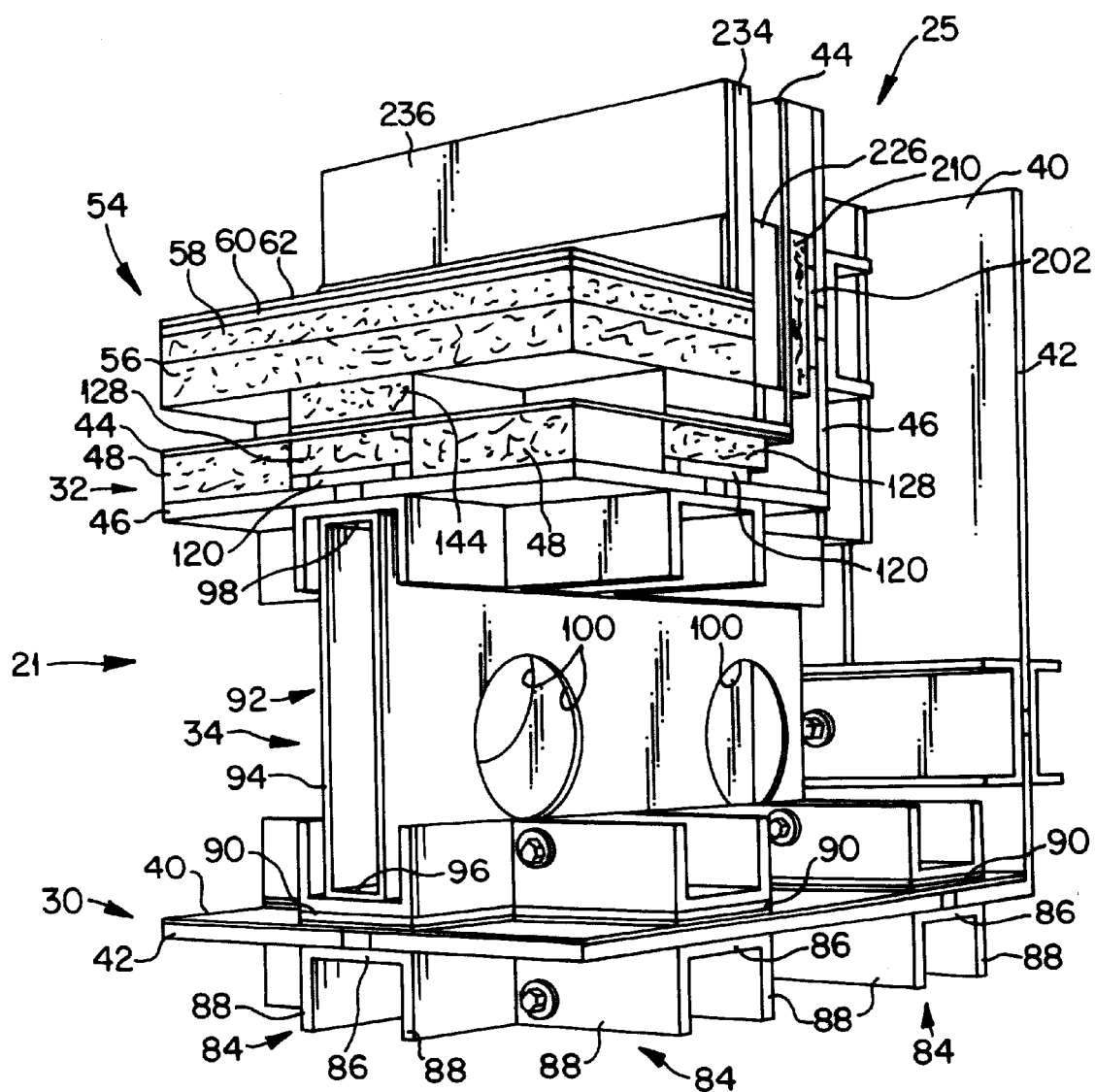
FIG. 2 is a fragmentary perspective view of the MSR floor and wall construction illustrating the interior and exterior shells.
Figure 3:
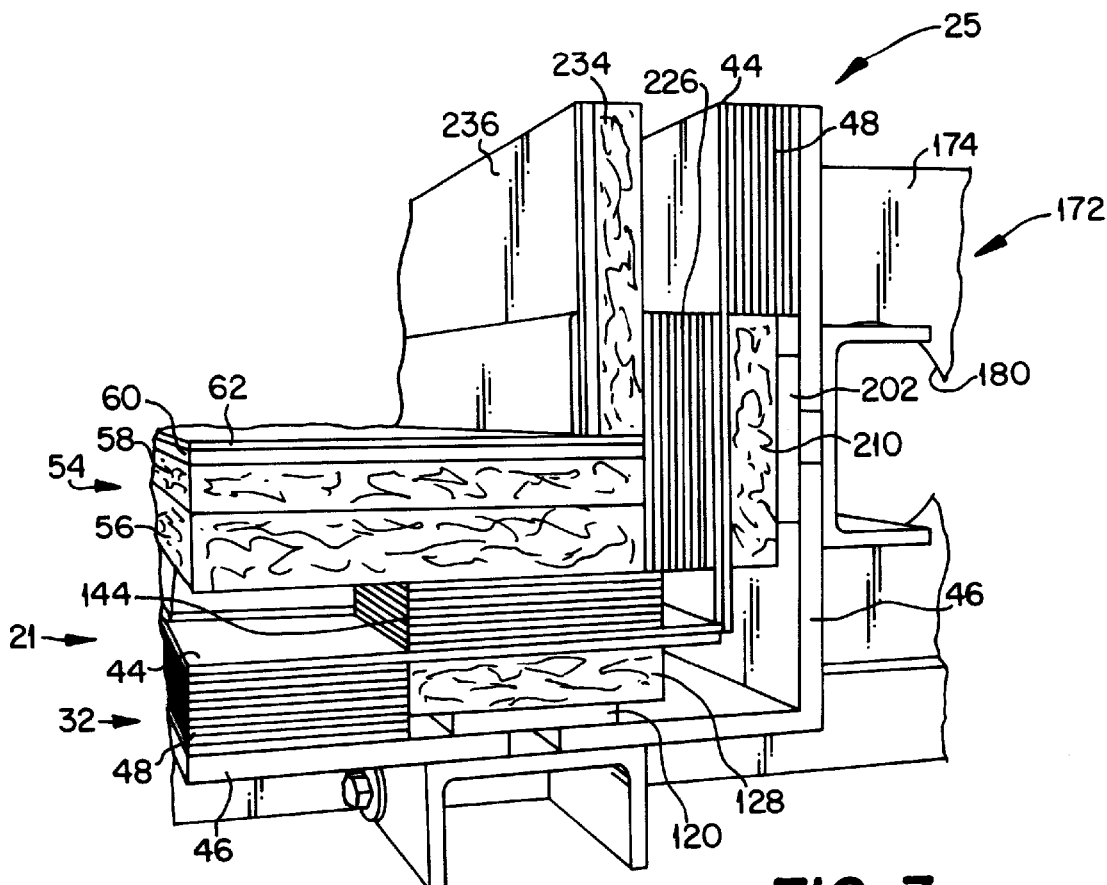
FIG. 3 is a fragmentary side view of the MSR floor and wall construction illustrating the interior and exterior shells.

The spring washer 80 is positioned around the bottom of the spacer sleeve 78 between the upper surface of the supporting nut 76 and the lower surface of the supporting sleeve 82, which may be made from stainless steel as well. The supporting sleeve 82 journaled about the lower portion of the spacer sleeve 78 supports the upside-down U-shaped or cup-shaped bracket 84, which may be from aluminum. Although not illustrated in FIGS. 5 and 6, the spacer 92 may alternatively be disposed in a U-shaped aluminum bracket or stud as depicted in FIGS. 2 and 4. The bracket or stud 84 includes a horizontally disposed suitably sized member or deck 86 which directly supports the exterior shell 30. The bracket 84 includes vertically disposed walls 88 which are integrally formed at the edges of the deck 86 and extend downwardly from the deck 86 to increase the structural rigidity of the deck 86. The exterior shell 30, the bracket 84 and the supporting sleeve 82 move or vibrate upwardly or downwardly independent of the bolt 70, the supporting nut 76 and the spacer sleeve 78. The spring washer 80 acts to absorb vibration of the parent building or the earth in order to dampen this vibration or movement to prevent this vibration from being transmitted to the inner and outer shields 40 and 42 of the exterior shell 30. The independent relationship between the exterior shell 30 and the supporting nut 76 also prevents downward force or vibration from the weight bearing floor 54 from affecting the exterior shell 30. The construction of the exterior section 50 of the floor separator 34 thereby prevents the deterioration of the attenuation characteristics of the exterior shell 30.

A non-conductive insulation strip 90, defining a centrally located annular opening 91, is disposed around the upper portion of the spacer sleeve 78 and is situated between the spacer 92 and the top surface of the inner shield 40, unless the spacer 92 is alternatively disposed in a U-shaped bracket as depicted in FIG. 2. The insulation strip 90 is preferably made from polyvinylchlorine (PVC) although it could be made from other suitable materials. The insulation strip 90 provides a dielectric separation between the exterior shell 30 and the interior shell 32.

The spacer 92 includes a vertically disposed body 94, a horizontally disposed end wall 96 attached to the bottom of the body 94 and a horizontally disposed end wall 98 attached to the top of the body 94. The spacer 92 defines one or more suitably sized slots 100 in the body 94 for providing access to a chamber 101 within the spacer 92. As depicted in FIG. 2, opposing slots 100 may be formed in the body 94 to provide additional access to the chamber 101. The shaft 74 of bolt 70 extends through an annular opening 103 formed in the bottom end wall 96 of the spacer 92. The spacer 92 is preferably made from a non-magnetically permeable material such as aluminum which co-acts with the air gap 49 to magnetically decouple the exterior and interior shells 30 and 32. It should be appreciated that the spacer 92 could be made of other suitable non-magnetically permeable material and could have a different size, structural configuration or shape.

A horizontally disposed non-conductive insulating ring 102 is disposed in the annular opening 91 defined by the insulation strip 90 and is situated between the top edge of the spacer sleeve 78 and the bottom end wall 96 of the spacer 92. A vertically disposed cylindrical, insulating sleeve or bushing 104 is journaled about the shaft 74 between the shaft 74 and the annular opening 103 in the bottom end wall 96 of the spacer 92 and rests on top of the insulating ring 102. A horizontally disposed non-conductive insulating ring 106 rests on the top surface of the bottom end wall 96 of the spacer 92. The ring 102, sleeve 104 and ring 106 are preferably manufactured of a polyamide although they could be made of other suitable non-conductive materials. The non-conductive insulating strip 90, ring 102, sleeve 104 and ring 106 co-act to electrically insulate the spacer 92 from the exterior shell 30 thereby providing a dielectric separation between the exterior and interior shells 30 and 32. A stainless steel hexagonal nut 110 is threaded on the shaft 74, and a stainless steel flat washer 108 is disposed between the nut 110 and the insulating ring 106. The nut 110 and the supporting nut 76 act together to secure the ring 102, sleeve 104, ring 106 and the spacer sleeve 78 in place. The spacer 92 is thereby independent from the exterior shell 30. Any vibration or downward force on the spacer 92 from the weight bearing floor 54 travels from the spacer 92 through the spacer sleeve 78, through the supporting nut 76, to the bolt 70 and ultimately to the vibration pad 64, thereby bypassing the exterior shell 30. Accordingly, the vibration in the spacer 92 from the weight bearing floor 54 does not cause deterioration of the attenuation characteristics of the exterior shell 30.

Turning now to FIG. 7, the interior section 52 of the floor separator 34 includes a bolt 112 having a shaft 114 which extends upwardly through and threads into an annular opening 115 in the top end wall 98 of the spacer 92 and threads into an adjustable member 140, preferably a nut. A flat washer 116, disposed around the bolt 112, separates a head 118 of the bolt 112 from, and provides additional purchase area against, the lower surface of the top end wall 98 of the spacer 92. The top end wall 98 of the spacer 92 supports the outer shield 46 of the interior shell 32. A highly conductive strip 120, preferably made of aluminum, provides the electrical contact between the separate aluminum sheets of the outer shield 46. A nut 124 threaded on the shaft 114 and a washer 122 secure the conductive strip 120 in place. The insulating layer 48 rests on the outer shield 46 and defines an annular notch 126 for receiving a cylindrical supporting ring 128 of insulating wood. The insulating ring 128 is supported by the insulating layer 48 and the conductive strip 120. The ring 128 and the insulating layer 48 support the inner shield 44 of the interior shell 32. The supporting ring 128 includes a circular tongue 130 which extends inward from the inner peripheral edge of the ring 128. A nut 134 threaded on the shaft 114 and a washer 135 secure the tongue 130 in place. The insulating layer 48 and the ring 128 provide magnetic decoupling between the inner shield 44 and the outer shield 46 of the interior shell 32.

A vertically disposed non-conductive cylindrical sleeve or bushing 136 is journaled about the shaft 114 between the shaft 114 and an annular opening 137 formed in the inner shield 44. The sleeve 136 rests on the top of the nut 134. A horizontally disposed non-conductive insulating ring 138 is positioned on top of the nut 134, around the sleeve 136 and below the bottom surface of the inner shield 44. The sleeve 136 and the ring 138 co-act to electrically insulate the inner shield 44 from the bolt 112, the outer shield 46 and the spacer 92. The inner shield 44 is thereby further electrically insulated from the inner and outer shields 40 and 42 of the exterior shell 30. The sleeve 136 and the insulating ring 138 are preferably manufactured of a non-conductive polyamide although they could be made of other suitable non-conductive materials.

The adjustable nut 140, preferably made of brass, is threaded on the shaft 114 of the bolt 112 and supports the weight bearing floor 54. The supporting nut 140 can be adjusted upwardly or downwardly on the shaft 114 of the bolt 112 in a conventional manner to adjust the height of the weight bearing floor 54. The nut 140 includes a conventional set screw 142 for locking the nut 140 at a desired position or height on the shaft 114 of the bolt 112. An insulating layer 144, preferably made of wood, is disposed between the inner shield 44 and the weight bearing floor 54. A cylindrical cut-out portion 146 is disposed between the insulating layer 144 and the weight bearing floor 54 to provide access to the set screw 142 in a conventional manner. The weight bearing floor 54 is supported independent of the interior shell 32 and especially the inner shield 44. The interior shell 32 is supported by the top end wall 98 of the spacer 92. The weight bearing floor 54, on the other hand, is supported by the supporting nut 140 which is supported by the bolt 112 that is threaded into the top end wall 98 of the spacer 92. As pressure is placed on the weight bearing floor 54, the plurality of floor separators 34 transfer such pressure through those separators to the vibration pad 64 thereby dampening such vibration without substantially deteriorating the exterior or interior shells 30 and 32. In other words, vibrations generated in the interior of the MSR 20 which are transmitted to the weight bearing floor 54 travel from the weight bearing floor 54, through the supporting nut 140, the bolt 112, the spacer 92, the bolt 70 and into the vibration pad 64 where the vibration is dampened by the absorption pad 66 of the vibration pad 64. Such dampening keeps the vibration from significantly deteriorating the attenuating characteristics of the exterior shell 30. The floor separator thereby dielectrically separates and magnetically decouples the exterior and interior shells 30 and 32.

Referring now to FIGS. 8 to 13, the dielectric ceiling separators 36 of the present invention and the dielectric wall separators 38 of the present invention are substantially identical and shall therefore be described together. The exterior and interior shells 30 and 32 are magnetically decoupled and dielectrically separated by the plurality of ceiling separators 36 and the wall separators 38. In particular, the exterior and interior shells 30 and 32, respectively, are connected by a plurality of non-magnetically permeable spacers 172, as discussed in detail below. The air gap or space 49 created by the spacers 172 is the same size as the air gap 49 created by the floor separators 34 and provides a magnetic decoupling between the exterior and interior shells 30 and 32. The magnetic decoupling around the entire MSR is thereby constant.

Figure 9:
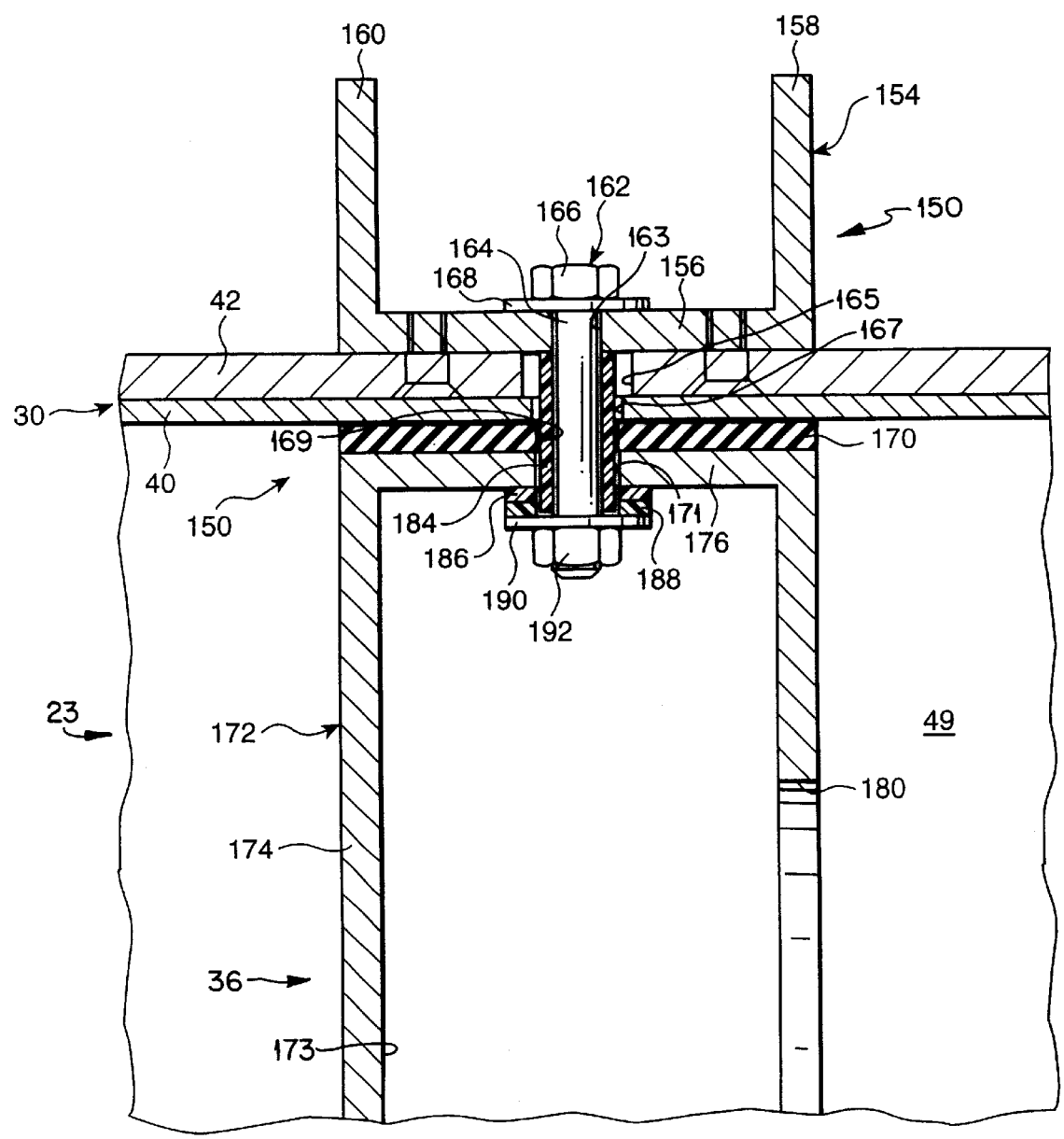
FIG. 9 is an enlarged cross-sectional view of the exterior shell of the MSR and the exterior section of the ceiling separator.
Figure 10:
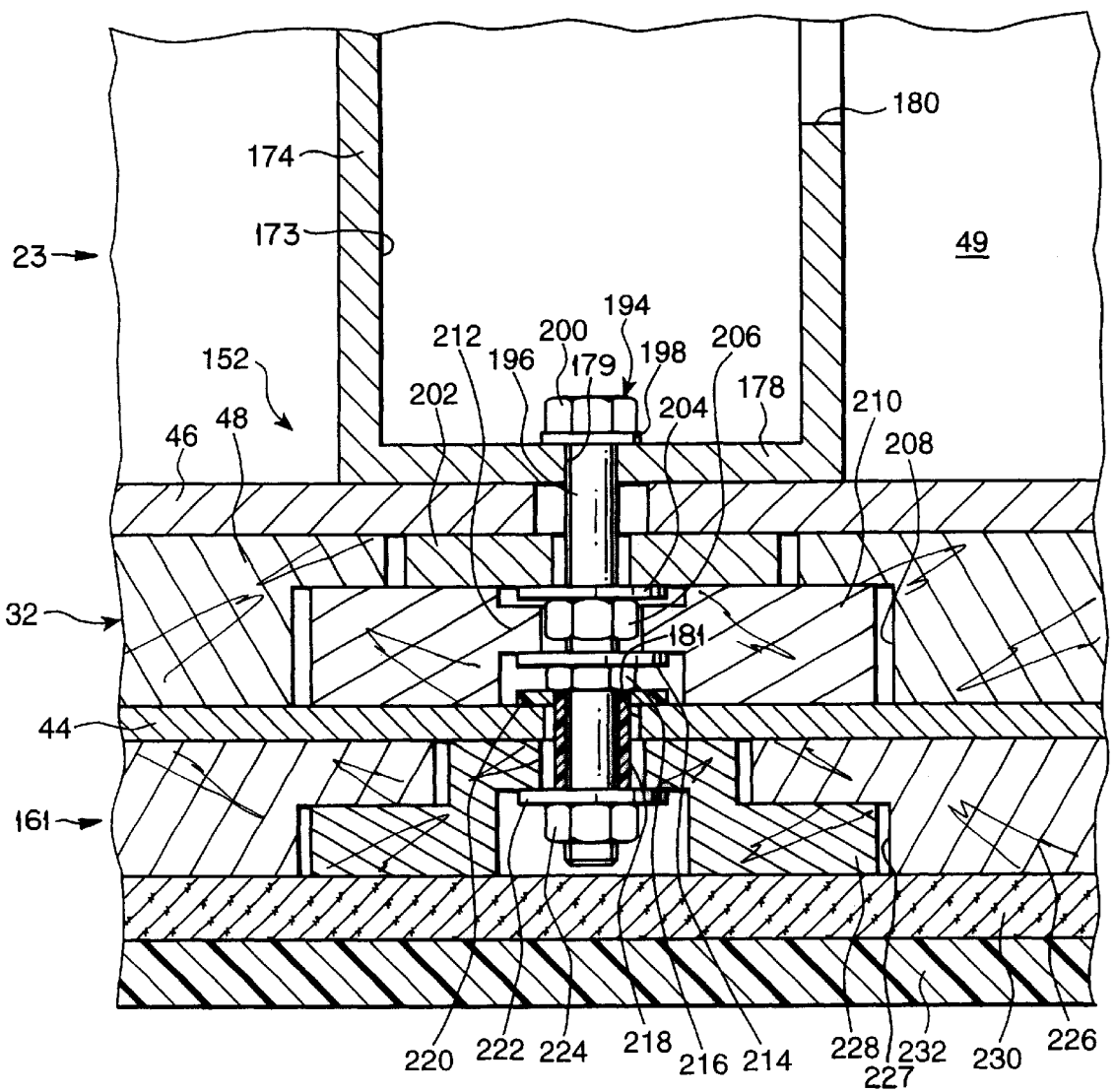
FIG. 10 is an enlarged cross sectional view of the interior shell of the MSR and the interior section of the ceiling separator.
Figure 11:
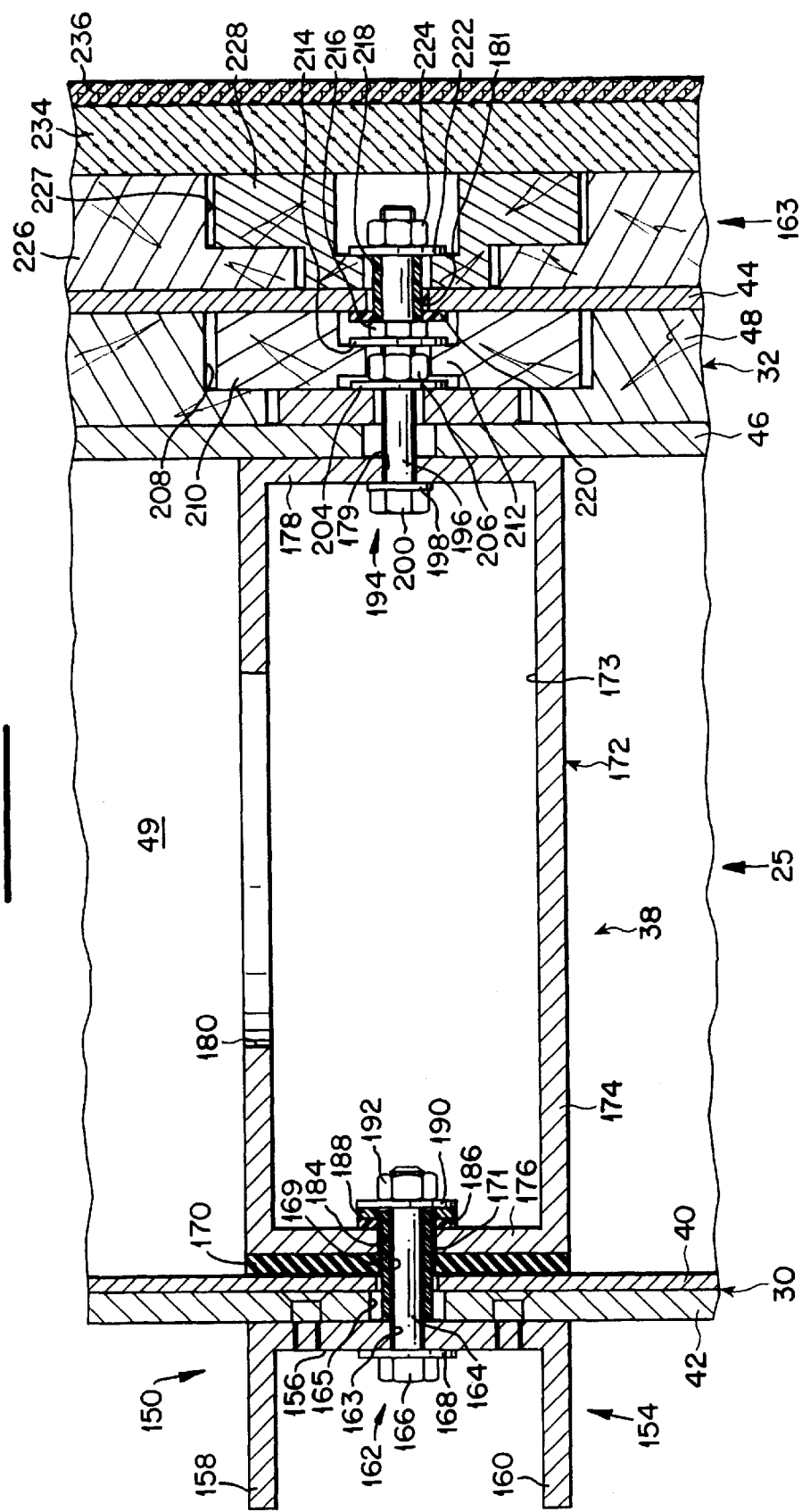
FIG. 11 is a fragmentary cross-sectional view of the MSR wall construction of the present invention illustrating the wall separator extending through the interior and exterior shells of the MSR.

The ceiling and wall separators 36 and 38 include an exterior section 150 as illustrated in FIGS. 9 and 12 which extends through the exterior shell 30 and an interior section 152 as illustrated in FIGS. 10 and 13 which extends through the interior shell 32. The exterior sections 150 of the ceiling and wall separators 36 and 38 support the exterior shell 30, extend through the exterior shell 30 and connect to the spacers 172. The spacers 172 support the interior shell 32. The interior sections 152 are connected to the spacers 172, extend through the interior shell 32 and support an interior portion 161 of the ceiling 23 or an interior portion 163 of the wall 25, respectively. The exterior sections 150 of the ceiling and wall separators 36 and 38 include a bolt 162 and a bracket or stud 154. The bolt 162, and in particular a shaft 164 of the bolt 162, extends through an opening 163 formed in the bracket 154, through a pair of annular openings 165 and 167 formed in the inner and outer shields 40 and 42, through an opening 169 formed in a non-conductive insulating strip 170, through an opening 171 formed in the end wall of the spacer 172 and connects with a nut 192. The bracket 154 is U-shaped and preferably made of aluminum and has a central section 156 which engages the exterior surface of the outer shield 42 and has a pair of bracing members 158 and 160 which extend perpendicularly from the central section 156. The bracing members 158 and 160 increase the structural rigidity of the bracket 154. The spacer 172 includes a body 174, and end walls 176 and 178 at each end of the body 174. One or more slots 180 may be formed in the body 174 of the spacer 172 to provide access to a chamber 173 defined by the spacer 172. Opposing slots 180 may be formed in the body 174 to provide additional access to the chamber 173. The spacers 172 may alternatively be disposed in U-shaped brackets.

A non-conductive sleeve or bushing 184 is journaled around the shaft 164 of the bolt 162 and extends from the central section 156 of the supporting bracket 154 to a washer 190 disposed between the nut 192 and the non-conductive sleeve 184. A pair of non-conductive insulating rings 186 and 188 are disposed around the sleeve 184 between the end wall 176 of the spacer 172 and the washer 190. The insulating rings 186 and 188 act in concert with the insulating layer 170 and the sleeve 184 to electrically insulate the spacer 172 from exterior shell 30. The flat washer 190, preferably made of stainless steel, and the nut 192, preferably hexagonal in shape and made of stainless steel, co-act with a head 166 of the bolt 162 and a washer 168 to secure the exterior shell 30 between the supporting bracket 154 and the spacer 172. The sleeve 186 and the insulating rings 188 and 190 are preferably manufactured from a polyamide although they could be made of other suitable non-conductive materials. The insulating strip 170, the sleeve 184 and the rings 188 and 190 co-act to electrically insulate the exterior shell 30 from the spacer 172 and thereby provide a dielectric separation between the exterior shell 30 and the interior shell 32.

The interior section 152 of the ceiling separator 36 or wall separator 38 as illustrated in FIGS. 10 and 13, respectively, includes a bolt 194 having a shaft 196 which extends through an annular opening 179 in the end wall 178 of the spacer 172 and through the interior shell 32. A flat washer 198, which provides additional purchase area, separates a head 200 of the bolt 194 from an inner surface of the end wall 178 of the spacer 172 which is adjacent to the outer shield 46 of the interior shell 32. The outer shield 46 is secured to the spacer 172 by an overlapping strip 202 of a highly electrically conductive material, preferably aluminum, a washer 204 and a nut 206 threaded on the shaft 196 of the bolt 194. The overlapping strip 202 provides electrical contact between the separate sections of the shield 46. The insulating layer 48 is adjacent to the outer shield 46 and defines an annular notch 208 for receiving a supporting ring 210. The supporting ring 210 is adjacent to the inner shield 44 of the interior shell 32. The supporting ring 210 includes a tongue 212. A nut 216 and a washer 214 secure the tongue 212 in place. A non-conductive cylindrical sleeve or bushing 218 is journaled about the shaft 196 and extends through an opening 181 formed in the inner shield 44 between the nut 216 and a washer 222. A nut 224 threaded on the bolt 194 secures the sleeve 218 in place. A non-conductive insulating ring 220 positioned around the sleeve 218 adjacent to the nut 216 and the inner shield 44 co-acts with the sleeve 218 to electrically insulate the inner shield 44 from the bolt 194 and the spacer 172. The sleeve 218 and the washer 220 are preferably manufactured from a polyamide although they could be made of other suitable non-conductive materials.

A non-conductive insulating layer 226, preferably made of wood, is disposed adjacent to the inner shield 44 and defines an opening 227 for receiving a hat-shaped cutout member 228. The cut-out member 228 is secured to the inner shield 44 by the washer 222 and the nut 224. The interior portion 161 of the ceiling 23 includes a base layer 230 of chipboard and a suitable ceiling tile 232 as illustrated in FIG. 10. The interior portion 163 of the wall 25 includes a base layer 234 of chipboard and a wallpaper or covering 236 as illustrated in FIG. 13. The ceiling and wall constructions of the present invention are thereby similar to the floor construction of the present invention, and perform similar or identical functions as described above to dielectrically separate and magnetically decouple the interior and exterior shells 32 and 30 of the MSR 20 as well as the inner and outer shields 44 and 46 of the interior shell 32 of the MSR 20.

It will be understood that modifications and variations may be effected without departing from the scope of the novel concepts of the present invention, and it is understood that this application is to be limited only by the scope of the appended claims.

The invention is hereby claimed as follows:

1. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor, ceiling and walls;

an interior shell having an electrically conductive non-magnetic shield and a magnetically permeable shield, said interior shell disposed within the exterior shell and extending substantially throughout the floor, ceiling and walls; and a plurality of separators which extend through and support the exterior shell and the interior shell and magnetically decouple the exterior shell and the interior shell by sufficiently separating the exterior shell from the interior shell, said separators including first non-conductive insulation members disposed between the exterior shell and the interior shell which dielectrically separate the exterior shell from the interior shell.

2. The magnetically shielded room of claim 1, which further includes a non-conductive insulating layer disposed between the electrically conductive shield and the magnetically permeable shield of the interior shell which magnetically decouples the electrically conductive shield from the magnetically permeable shield of the interior shell.

3. The magnetically shielded room of claim 2, wherein the separators include second non-conductive insulation members disposed between the electrically conductive shield and the magnetically permeable shield of the interior shell which dielectrically separate the electrically conductive shield of the interior shell and the magnetically permeable shield of interior shell.

4. The magnetically shield room of claim 3, wherein the first and second non-conductive insulation members are composed of a polyamide.

5. The magnetically shielded room of claim 1, wherein the magnetically permeable shields of the interior and exterior shells are composed of a nickel alloy and the electrically conductive shields of the interior and exterior shells are composed of aluminum.

6. The magnetically shielded room of claim 1, wherein said separators include:
a plurality of floor separators supporting the weight bearing floor, extending through and supporting the exterior shell and the interior shell in the floor and magnetically decoupling the exterior shell from the interior shell in the floor by sufficiently separating the exterior shell from the interior shell in the floor;
a plurality of ceiling separators extending through and supporting the exterior shell and the interior shell in the ceiling and magnetically decoupling the exterior shell from the interior shell in the ceiling by sufficiently separating the exterior shell from the interior shell in the ceiling; and
a plurality of wall separators extending through and supporting the exterior shell and the interior shell in the walls and magnetically decoupling the exterior shell from the interior shell in the walls by sufficiently separating the exterior shell from the interior shell in the walls.

7. The magnetically shielded room of claim 6, wherein each floor separator includes an exterior section extending through the exterior shell, an interior section extending through the interior shell and a spacer between and connected to the exterior section and the interior section, said exterior section, said interior section and said spacer co-act to support the weight bearing floor independent of the exterior shell and the interior shell and to dampen vibration from the weight bearing floor and the substrate which lessens deterioration of the attenuation characteristics of the interior and exterior shells.

8. The magnetically shielded room of claim 7, wherein the first non-conductive insulation members include a non-conductive insulation strip disposed between the spacer and the exterior shell.

9. The magnetically shielded room of claim 7, wherein the exterior section includes a vibration pad having a compressible non-conductive rubber absorption pad which electrically insulates the magnetically shielded room from the substrate and dampens vibration from the substrate and from the weight bearing floor.

10. The magnetically shielded room of claim 9, wherein the exterior section further includes an adjustable support member and a spacer sleeve, the adjustable support member is connected to the vibration pad and the spacer sleeve rests on the support member and extends through the exterior shell to support the spacer.

11. The magnetically shielded room of claim 10, wherein the first non-conductive insulation members include a first non-conductive insulating ring disposed between the spacer sleeve and the spacer.

12. The magnetically shielded room of claim 11, wherein the exterior section includes a bolt and the first non-conductive insulation members include a first non-conductive insulating sleeve disposed between the bolt and the spacer, said bolt is attached to the vibration pad and extends from the vibration pad through the adjustable support member, the spacer sleeve, the first non-conductive insulating ring and the first non-conductive insulating sleeve.

13. The magnetically shielded room of claim 12, which further includes a nut attached to the bolt, and the first non-conductive insulation members include a second non-conductive insulating ring disposed between the nut and the spacer.

14. The magnetically shielded room of claim 13, wherein the first non-conductive insulating sleeve and the first and second non-conductive insulating rings are composed of a polyamide.

15. The magnetically shielded room of claim 10, which further includes a spring washer disposed between the adjustable support member and the exterior shell which absorbs vibrations from the weight bearing floor and the substrate.

16. The magnetically shielded room of claim 7, wherein the interior section further includes an adjustable support member which is connected to the spacer and supports the weight bearing floor.

17. The magnetically shielded room of claim 16, wherein the interior section includes a bolt and second non-conductive insulation members, said second non-conductive insulation members include a first non-conductive insulating sleeve disposed between the bolt and the magnetically permeable shield of the interior shell, said bolt is connected to the spacer and extends from the spacer through the electrically conductive shield of the interior shell, the first non-conductive insulating sleeve and is connected to the adjustable support member.

18. The magnetically shielded room of claim 17, which further includes a nut attached to the bolt, and the second non-conductive insulation members include a first non-conductive insulating ring disposed between the nut and the magnetically permeable shield of the interior shell.

19. The magnetically shielded room of claim 18, wherein the first non-conductive insulating sleeve and the first non-conductive insulating ring are composed of a polyamide.

20. The magnetically shielded room of claim 7, wherein the spacers are composed of a non-magnetically permeable material.

21. The magnetically shielded room of claim 20, wherein the spacers are composed of aluminum.

22. A magnetically shielded room which rests on a substrate, said magnetically shielded room comprising:
an exterior shell having an electrically conductive shield and a magnetically permeable shield;
an interior shell, disposed within the exterior shell, having a electrically conductive shield and a magnetically permeable shield;

a weight bearing floor disposed within the interior shell; and a plurality of floor separators which support the weight bearing floor, extend through and support the exterior shell and the interior shell, each floor separator supports the weight bearing floor independent of the exterior shell and interior shell and dampens vibration from the weight bearing floor and the substrate which lessens deterioration of the attenuation characteristics of the interior and exterior shells.

23. The magnetically shielded room of claim 22, wherein the magnetically permeable shields of the interior and exterior shells are composed of a nickel alloy and the electrically conductive shields of the interior and exterior shells are composed of aluminum.

24. The magnetically shielded room of claim 22, wherein each floor separator includes an exterior section extending through the exterior shell, an interior section extending through the interior shell and a spacer between and connected to the exterior section and the interior section.

25. The magnetically shielded room of claim 24, wherein the exterior section includes a vibration pad having a compressible absorption pad which dampens vibration from the substrate and from the weight bearing floor.

26. The magnetically shielded room of claim 25, wherein the exterior section further includes an adjustable support member and a spacer sleeve, the adjustable support member is connected to the vibration pad and the spacer sleeve rests on the support member and extends through the exterior shell to support the spacer.

27. The magnetically shielded room of claim 26, wherein the exterior section includes a bolt attached to the vibration pad which extends from the vibration pad through the adjustable support member, the spacer sleeve and the spacer.

28. The magnetically shielded room of claim 26, which further includes a spring washer disposed between the adjustable support member and the exterior shell which absorbs vibrations from the weight bearing floor and the substrate.

29. The magnetically shielded room of claim 24, wherein the interior section further includes an adjustable support member which is connected to the spacer and supports the weight bearing floor.

30. The magnetically shielded room of claim 29, wherein the interior section includes a bolt connected to the spacer which extends from the spacer through the electrically conductive shield of the interior shell and is connected to the adjustable support member.

31. The magnetically shielded room of claim 24, wherein the spacers are composed of a non-magnetically permeable material and magnetically decouple the exterior shell from the interior shell.

32. The magnetically shielded room of claim 31, which further includes non-conductive insulation members in the floor separators which dielectrically separate the exterior shell from the interior shell.

33. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor;

an interior shell having an electrically conductive non-magnetic shield and a magnetically permeable shield, said interior shell disposed within the exterior shell and extending substantially throughout the floor; and a plurality of floor separators including an exterior section extending through the exterior shell, an interior section extending through the interior shell and a spacer between and connected to the exterior section and the interior section, said exterior section, said interior section and said spacer co-act to support the weight bearing floor independent of the exterior shell and the interior shell and to dampen vibration from the weight bearing floor and the substrate, said spacer magnetically decouples the exterior shell and the interior shell by sufficiently separating the exterior shell from the interior shell, and said separators include first non-conductive insulation members disposed between the exterior shell and the interior shell which dielectrically separate the exterior shell from the interior shell.

34. The magnetically shielded room of claim 33, which further includes a non-conductive insulating layer disposed between the electrically conductive shield and the magnetically permeable shield of the interior shell which magnetically decouples the electrically conductive shield from the magnetically permeable shield of the interior shell.

35. The magnetically shielded room of claim 34, wherein each floor separator includes second non-conductive insulation members disposed between the electrically conductive shield and the magnetically permeable shield of the interior shell which dielectrically separate the electrically conductive shield of the interior shell and the magnetically permeable shield of interior shell.

36. The magnetically shielded room of claim 33, wherein the exterior section includes a vibration pad having a compressible non-conductive rubber absorption pad which electrically insulates the magnetically shielded room from the substrate and dampens vibration from the substrate and from the weight bearing floor.

37. The magnetically shielded room of claim 36, wherein the exterior section further includes an adjustable support member and a spacer sleeve, the adjustable support member is connected to the vibration pad and the spacer sleeve rests on the support member and extends through the exterior shell to support the spacer.

38. The magnetically shielded room of claim 37, wherein the first non-conductive insulation members include a first non-conductive insulating ring disposed between the spacer sleeve and the spacer.

39. The magnetically shielded room of claim 38, wherein the exterior section includes a bolt and the first non-conductive insulation members include a first non-conductive insulating sleeve disposed between the bolt and the spacer, said bolt is attached to the vibration pad and extends from the vibration pad through the adjustable support member, the spacer sleeve, the first non-conductive insulating ring and the first non-conductive insulating sleeve.

40. The magnetically shielded room of claim 39, which further includes a nut attached to the bolt, and the first non-conductive insulation members include a second non-conductive insulating ring disposed between the nut and the spacer.

41. The magnetically shielded room of claim 37, which further includes a spring washer disposed between the adjustable support member and the exterior shell which absorbs vibrations from the weight bearing floor and the substrate.

42. The magnetically shielded room of claim 33, wherein the interior section further includes an adjustable support member which is connected to the spacer and supports the weight bearing floor.

43. The magnetically shielded room of claim 42, wherein the interior section includes a bolt and second non-conductive insulation members, said second non-conductive insulation members include a first non-conductive insulating sleeve disposed between the bolt and the magnetically permeable shield of the interior shell, said bolt is connected to the spacer and extends from the spacer through the electrically conductive shield of the interior shell, the first non-conductive insulating sleeve and is connected to the adjustable support member.

44. The magnetically shielded room of claim 43, which further includes a nut attached to the bolt, and the second non-conductive insulation members include a first non-conductive insulating ring disposed between the nut and the magnetically permeable shield of the interior shell.

45. A magnetically shielded room which rests on a substrate and has a floor including a weight bearing floor, a ceiling and a plurality of walls, said magnetically shielded room comprising:

an exterior shell which extends substantially throughout the floor, ceiling and walls;

an interior shell, disposed within the exterior shell, which extends substantially throughout the floor, ceiling and walls;

means in the floor and walls for magnetically decoupling the exterior shell from the interior shell; and means in the floor and walls for dielectrically separating the exterior shell from the interior shell, whereby the magnetically decoupling means and the dielectrically separating means co-act to magnetically decouple and dielectrically separate the exterior shell from the interior shell.

46. The magnetically shielded room of claim 45, wherein the interior shell includes an electrically conductive non-magnetic shield, a magnetically permeable shield and means disposed between the electrically conductive shield and the magnetically permeable shield of the interior shell for magnetically decoupling the electrically conductive shield from the magnetically permeable shield of the interior shell.

47. The magnetically shielded room of claim 46, wherein the dielectric separation means includes means disposed between the electrically conductive shield and the magnetically permeable shield of the interior shell for dielectrically separating the electrically conductive shield of the interior shell and the magnetically permeable shield of interior shell.

48. The magnetically shielded room of claim 45, which further includes adjustable means for supporting the exterior shell and the interior shell and for supporting the weight bearing floor independent from the exterior shell and the interior shell.

49. The magnetically shielded room of claim 45, which further includes means for damping the vibration in the weight bearing floor and the substrate.

50. A magnetically shielded room which rests on a substrate and has a floor including a weight bearing floor, a ceiling and a plurality of walls, said magnetically shielded room comprising:

an exterior shell which extends substantially throughout the floor, ceiling and walls;

an interior shell, disposed within the exterior shell, which extends substantially throughout the floor, ceiling and walls;

means for supporting the exterior shell and the interior shell and for supporting the weight bearing floor independent from the exterior shell and the interior shell; and means for damping the vibration in the weight bearing floor and the substrate, whereby the supporting means and the damping means co-act to lessen deterioration of the attenuation characteristics of the interior and exterior shells.

51. The magnetically shielded room of claim 50, which further includes means for magnetically decoupling the exterior shell from the interior shell.

52. The magnetically shielded room of claim 50, which further includes means for dielectrically separating the exterior shell from the interior shell.

53. A magnetically shielded room which rests on a substrate and has a floor including a weight bearing floor, a ceiling and a plurality of walls, said magnetically shielded room comprising:

an exterior shell which extends substantially throughout the floor, ceiling and walls;

an interior shell, disposed within the exterior shell, which extends substantially throughout the floor, ceiling and walls;

means for magnetically decoupling the exterior shell from the interior shell;

means for dielectrically separating the exterior shell from the interior shell;

means for supporting the exterior shell and the interior shell and for supporting the weight bearing floor independent from the exterior shell and the interior shell; and means for damping the vibration in the weight bearing floor and the substrate, whereby the magnetically decoupling means and the dielectrically separating means co-act to magnetically decouple and dielectrically separate the exterior shell from the interior shell and the supporting means and the damping means co-act to lessen deterioration of the attenuation characteristics of the interior and exterior shells.

54. The magnetically shielded room of claim 53, wherein the interior shell includes an electrically conductive non-magnetic shield, a magnetically permeable shield and means disposed between the electrically conductive shield and the magnetically permeable shield of the interior shell for magnetically decoupling the electrically conductive shield of the interior shell and the magnetically permeable shield of interior shell.

55. The magnetically shielded room of claim 54, wherein the dielectric separation means includes means disposed between the electrically conductive shield and the magnetically permeable shield of the interior shell for dielectrically separating the electrically conductive shield of the interior shell and the magnetically permeable shield of interior shell.

56. A magnetically shielded room which rests on a substrate and has a floor including a weight bearing floor, a ceiling and a plurality of walls, said magnetically shielded room comprising:

an exterior shell which extends substantially throughout the floor, ceiling and walls;

an interior shell, disposed within the exterior shell, which extends substantially throughout the floor, ceiling and walls;

means in the floor and ceiling for magnetically decoupling the exterior shell from the interior shell; and means in the floor and ceiling for dielectrically separating the exterior shell from the interior shell, whereby the magnetically decoupling means and the dielectrically separating means co-act to magnetically decouple and dielectrically separate the exterior shell from the interior shell.

57. The magnetically shielded room of claim 56, wherein the interior shell includes an electrically conductive non-magnetic shield, a magnetically permeable shield and means disposed between the electrically conductive shield and the magnetically permeable shield of the interior shell for magnetically decoupling the electrically conductive shield from the magnetically permeable shield of the interior shell.

58. The magnetically shielded room of claim 57, wherein the dielectric separation means includes means disposed between the electrically conductive shield and the magnetically permeable shield of the interior shell for dielectrically separating the electrically conductive shield of the interior shell and the magnetically permeable shield of interior shell.

59. The magnetically shielded room of claim 56, which further includes adjustable means for supporting the exterior shell and the interior shell and for supporting the weight bearing floor independent from the exterior shell and the interior shell.

60. The magnetically shielded room of claim 56, which further includes means for damping the vibration in the weight bearing floor and the substrate.

61. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor, ceiling and walls;

an interior shell having an electrically conductive non-magnetic shield and a magnetically permeable shield, said interior shell disposed within the exterior shell and extending substantially throughout the floor, ceiling and walls, and a plurality of separators including floor separators and wall separators which each extend through and support the exterior shell and the interior shell and magnetically decouple the exterior shell and the interior shell by sufficiently separating the exterior shell from the interior shell, said separators including first non-conductive insulation members disposed between the exterior shell and the interior shell which dielectrically separate the exterior shell from the interior shell.

62. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor, ceiling and walls;

an interior shell having an electrically conductive non-magnetic shield and a magnetically permeable shield, said interior shell disposed within the exterior shell and extending substantially throughout the floor, ceiling and walls; and a plurality of separators including floor separators and ceiling separators which each extend through and support the exterior shell and the interior shell and magnetically decouple the exterior shell and the interior shell by sufficiently separating the exterior shell from the interior shell, said separators including first non-conductive insulation members disposed between the exterior shell and the interior shell which dielectrically separate the exterior shell from the interior shell.

63. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor, ceiling and walls;

an interior shell having an electrically conductive non-magnetic shield and a magnetically permeable shield, said interior shell disposed within the exterior shell and extending substantially throughout the floor, ceiling and walls, and a plurality of separators including wall separators which each extend through and support the exterior shell and the interior shell and magnetically decouple the exterior shell and the interior shell by sufficiently separating the exterior shell from the interior shell, said separators including first non-conductive insulation members disposed between the exterior shell and the interior shell which dielectrically separate the exterior shell from the interior shell.

64. A magnetically shielded room which rests on a substrate and has a floor including a weight bearing floor, a ceiling and a plurality of walls, said magnetically shielded room comprising:

an exterior shell having an electrically conductive non-magnetic shield and a magnetically permeable shield, said exterior shell extending substantially throughout the floor, ceiling and walls;

an interior shell having an electrically conductive non-magnetic shield and a magnetically permeable shield, said interior shell disposed within the exterior shell and extending substantially throughout the floor, ceiling and walls; and a plurality of separators including ceiling separators which each extend through and support the exterior shell and the interior shell and magnetically decouple the exterior shell and the interior shell by sufficiently separating the exterior shell from the interior shell, said separators including first non-conductive insulation members disposed between the exterior shell and the interior shell which dielectrically separate the exterior shell from the interior shell.

* * * * *